United States Patent
Thomas et al.

(10) Patent No.: US 11,472,708 B2
(45) Date of Patent: Oct. 18, 2022

(54) METHOD OF MAKING GRAPHENE STRUCTURES AND DEVICES

(71) Applicant: Paragraf Limited, Somersham (GB)

(72) Inventors: Simon Thomas, Somersham (GB); Ivor Guiney, Somersham (GB)

(73) Assignee: Paragraf Limited, Somersham (GB)

( * ) Notice: Subject to any disclaimer, the term of this patent is extended or adjusted under 35 U.S.C. 154(b) by 98 days.

(21) Appl. No.: 16/961,322

(22) PCT Filed: Jan. 10, 2019

(86) PCT No.: PCT/GB2019/050063
§ 371 (c)(1),
(2) Date: Jul. 10, 2020

(87) PCT Pub. No.: WO2019/138232
PCT Pub. Date: Jul. 18, 2019

(65) Prior Publication Data
US 2020/0361775 A1 Nov. 19, 2020

(30) Foreign Application Priority Data

Jan. 11, 2018 (GB) ..................................... 1800445

(51) Int. Cl.
*C01B 32/186* (2017.01)
*C01B 32/194* (2017.01)
(Continued)

(52) U.S. Cl.
CPC .......... *C01B 32/186* (2017.08); *C01B 32/194* (2017.08); *C23C 16/26* (2013.01);
(Continued)

(58) Field of Classification Search
CPC ... C23C 16/26; C23C 16/45572; C23C 16/56; C23C 14/0605; C23C 14/0036; C01B 32/186; C01B 32/194
See application file for complete search history.

(56) References Cited

U.S. PATENT DOCUMENTS

| | | | |
|---|---|---|---|
| 8,785,261 B2* | 7/2014 | King | H01L 21/02057 257/E21.409 |
| 2012/0181507 A1* | 7/2012 | Dimitrakopoulos | H01L 29/7781 257/29 |

(Continued)

FOREIGN PATENT DOCUMENTS

| CN | 104073786 A | 10/2014 |
|---|---|---|
| JP | 2015000843 A | 1/2015 |

(Continued)

OTHER PUBLICATIONS

Bleu, Yannick, et al., "Review of Graphene Growth From a Solid Carbon Source by Pulsed Laser Deposition (PLD)". Frontiers in Chemistry, Nov. 2018, vol. 6, Article 572, pp. 1-18.*

(Continued)

*Primary Examiner* — Bret P Chen
(74) *Attorney, Agent, or Firm* — Stinson LLP

(57) ABSTRACT

A method for the production of a graphene layer structure having from 1 to 100 graphene layers, the method comprising providing a substrate having a thermal resistance equal to or greater than that of sapphire, on a heated susceptor in a reaction chamber, the chamber having a plurality of cooled inlets arranged so that, in use, the inlets are distributed across the substrate and have a constant separation from the substrate, supplying a flow comprising a precursor compound through the inlets and into the reaction chamber to thereby decompose the precursor compound and form graphene on the substrate, wherein the inlets are cooled to less (Continued)

than 100° C., preferably 50 to 60° C., and the susceptor is heated to a temperature of at least 50° C. in excess of a decomposition temperature of the precursor, using a laser to selectively ablate graphene from the substrate, wherein the laser has a wavelength in excess of 600 nm and a power of less than 50 Watts.

15 Claims, 1 Drawing Sheet

(51) Int. Cl.

| | | |
|---|---|---|
| *C23C 16/26* | (2006.01) | |
| *C23C 16/455* | (2006.01) | |
| *C23C 16/56* | (2006.01) | |
| *C30B 25/18* | (2006.01) | |
| *C30B 29/02* | (2006.01) | |
| *C30B 33/04* | (2006.01) | |
| *G01R 33/07* | (2006.01) | |
| *H01L 43/14* | (2006.01) | |

(52) U.S. Cl.
CPC ........ *C23C 16/45572* (2013.01); *C23C 16/56* (2013.01); *C30B 25/18* (2013.01); *C30B 29/02* (2013.01); *C30B 33/04* (2013.01); *G01R 33/07* (2013.01); *H01L 43/14* (2013.01); *C01B 2204/02* (2013.01); *C01B 2204/04* (2013.01)

(56) References Cited

U.S. PATENT DOCUMENTS

| | | | |
|---|---|---|---|
| 2013/0000961 A1* | 1/2013 | Strachan | B82Y 30/00 977/932 |
| 2013/0025918 A1* | 1/2013 | Strachan | C01B 32/19 977/932 |
| 2013/0082241 A1* | 4/2013 | Kub | H01L 31/028 257/E31.005 |
| 2014/0017444 A1 | 1/2014 | Shimizu et al. | |
| 2016/0108546 A1* | 4/2016 | Park | H01M 4/96 428/408 |

FOREIGN PATENT DOCUMENTS

| | | |
|---|---|---|
| JP | 2017125714 A | 7/2017 |
| WO | 2017029470 A1 | 2/2017 |

OTHER PUBLICATIONS

Sahin, R., et al., "Nanoscale patterning of graphene through femtosecond laser ablation". Applied Physics Letters 104, 053118 (2014) pp. 1-4.*
Yoo, Jae-Hyuck, et al., "Graphene folds by femtosecond laser ablation". Appl. Phys. Lett. 100, 233124 (2012) pp. 1-3.*
Dhar, S., et al., "A new route to graphene layers by selective laser ablation". AIP Advances 1, 022109 (2011) pp. 1-8.*
Xu, S.C., et al., "Direct synthesis of graphene on any nonmetallic substrate based on KrF laser ablation of ordered pyrolytic graphite". 2014 Laser Phys. Lett. 11 096001, pp. 1-5.*
Witte, M J, et al., "Laser-Induced Spectroscopy of Graphene Ablation in Air". Journal of Physics: Conference Series 548 (2014) 012052, pp. 1-3.*
Dong, Tianqi, et al., "Evaluating femtosecond laser ablation of graphene on SiO2/Si substrate". Journal of Laser Applications 28, 022202 (2016), 2 pages. Abstract Only.*
Lin, T.N., et al., "Laser-ablation production of graphene oxide nanostructures: from ribbons to quantum dots". Nanoscale, 2015, 7, 2708-2715.*
International Search Report and Written Opinion, PCT/GB2019/050063, dated Apr. 30, 2019, 13 pages.
Dong et al., "Evaluating femtosecond laser ablation of graphene on SiO2/Si substrate," Journal of Laser Applications, vol. 28, No. 2, May 2016, pp. 022202-1 to 022202-6.
Sahin et al. "Nanoscale patterning of graphene through femtosecond laser ablation," Applied Physic Letters, vol. 104, No. 5, 2014, pp. 053118-1 to 053118-4.
Huang et al., "Flexible graphene hall sensors with high sensitivity," 2015 IEEE International Electron Devices Meeting (IEDM), IEEE, Dec. 7, 2015, 33.5 1 to 33 5.4.
Xu et al., "Batch-fabricated high-performance graphene Hall elements," Scientific Reports, vol. 3, No. 1207, Feb. 4, 2013, p. 1-8.
Mackenzie et al., "Fabrication of CVD graphene-based devices via laser ablation for wafer-scale characterization," 2D Mater. 2, 2015, 6 pages.

* cited by examiner

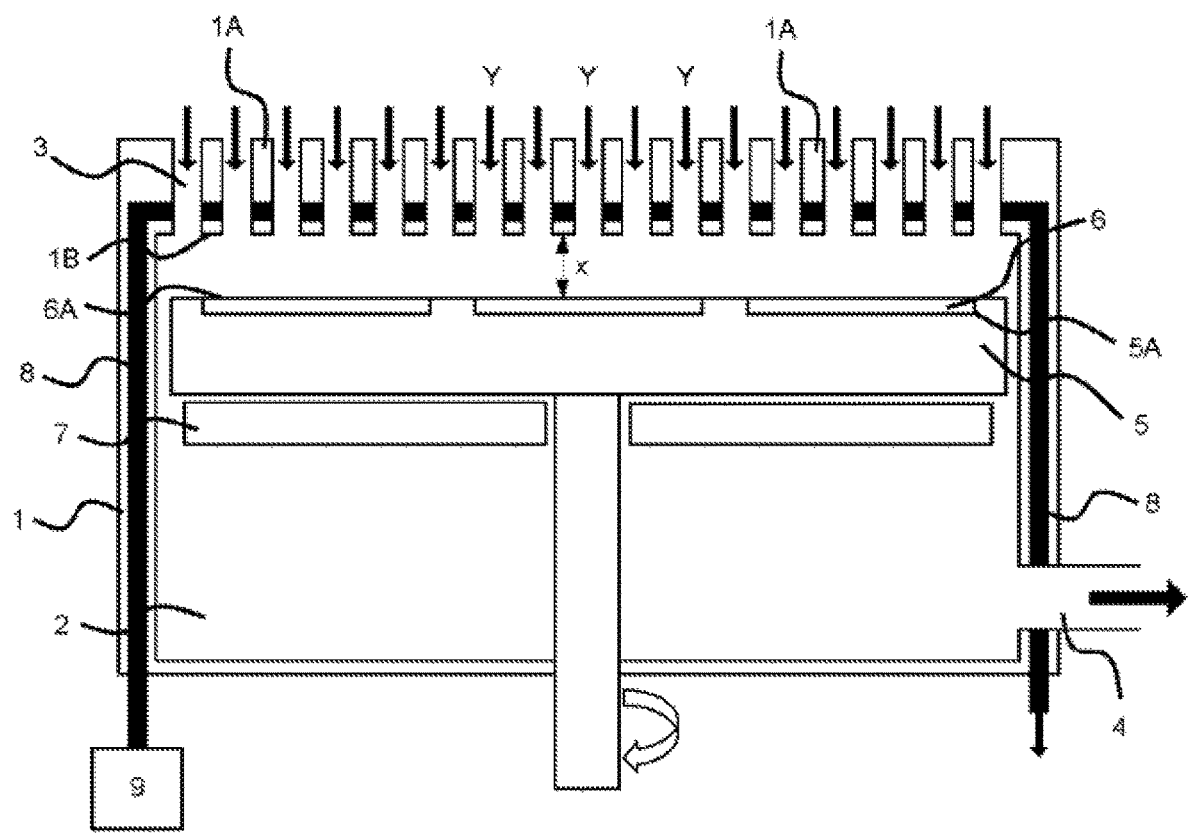

METHOD OF MAKING GRAPHENE STRUCTURES AND DEVICES

REFERENCE TO RELATED APPLICATION

This application is a U.S. national stage application based on PCT/GB2019/050063, filed Jan. 10, 2019, claiming priority to Great Britain application no. 1800445.7, filed Jan. 11, 2018, the entire disclosures of which are incorporated herein by reference.

FIELD OF THE INVENTION

The present invention relates to a method of making graphene layer structures and devices comprising graphene layer structures. In particular, the method of the invention provides an improved method for mass-producing devices comprising graphene layer structures.

BACKGROUND

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, vol. 6, March 2007, 183-191.

WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from a species released from the decomposed precursor; establishing a steep temperature gradient (preferably >1000° C. per meter) that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors.

The method of WO 2017/029470 provides two-dimensional materials with a number of advantageous characteristics including: very good crystal quality; large material grain size; minimal material defects; large sheet size; and are self-supporting. However, there remains a need for fast and low-cost processing methods for fabricating devices from the two-dimensional materials.

2D materials, vol. 2, 2015, 045003, Mackenzie et al., "Fabrication of CVD graphene-based devices via laser ablation for wafer-scale characterization" pages 2-6 discloses selective laser ablation of a wafer-scale graphene film for fabricating devices. Journal of Laser Applications, vol. 28, 2016, 022202 et at. "Evaluating femtosecond laser ablation of graphene on $SiO_2$/Si substrate" discloses micropatterning of graphene. Both of these literature references refer to pre-formed graphene layers placed onto silicon dioxide substrates. The graphene is not integrally formed on the substrate, and hence not physically or chemically bonded to the substrate surface which has a significant impact on laser interaction with graphene.

SUMMARY OF THE INVENTION

It is an object of the present invention to provide an improved method for producing graphene layer structures which overcome, or substantially reduce, problems associated with the prior art or at least provide a commercially useful alternative thereto.

Accordingly, the present invention provides a method for the production of a graphene layer structure having from 1 to 100, preferably 1 to 40, more preferably 1 to 10, graphene layers, the method comprising:

providing a substrate having a thermal resistance equal to or greater than that of sapphire, on a heated susceptor in a reaction chamber, the chamber having a plurality of cooled inlets arranged so that, in use, the inlets are distributed across the substrate and have a constant separation from the substrate, supplying a flow comprising a precursor compound through the inlets and into the reaction chamber to thereby decompose the precursor compound and form graphene on the substrate, wherein the inlets are cooled to less than 100° C., preferably 50 to 60° C., and the susceptor is heated to a temperature of at least 50° C. in excess of a decomposition temperature of the precursor, using a laser to selectively ablate graphene from the substrate, wherein the laser has a wavelength in excess of 600 nm and a power of less than 50 Watts.

BRIEF DESCRIPTION OF THE FIGURE

FIG. 1 shows a schematic cross-section of a graphene-layer growth chamber for use in the method described herein.

DETAILED DESCRIPTION OF PREFERRED EMBODIMENTS

The present disclosure will now be described further. In the following passages different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The inventors have found that if graphene is grown on the correct substrate it may be efficiently and effectively laser etched to produce graphene structures having complex defined geometry. This means that complete circuitry or specific devices may be formed on the substrate out of a continuous graphene layer. The traces and wiring for a device may therefore be formed entirely out of graphene with all of the associated advantages of graphene's electrical properties. Indeed, the inventors have found that using the method they can make a hall sensor in a single piece from a grown graphene layer structure.

The present disclosure relates to a method for the production of a graphene layer structure having from 1 to 100 graphene layers, preferably 1 to 40 graphene layers, more preferably 1 to 10. The more layers present, the better the electrical properties observed. Graphene is a well-known term in the art and refers to an allotrope of carbon comprising a single layer of carbon atoms in a hexagonal lattice. The term graphene used herein encompasses structures comprising multiple graphene layers stacked on top of each other. The term graphene layer is used herein to refer to a graphene monolayer. Said graphene monolayers may be doped or undoped. The graphene layer structures disclosed herein are distinct from graphite since the layer structures retain graphene-like properties.

The method comprises a first step of providing a substrate having a thermal resistance equal to or greater than that of sapphire. The inventors have found that use of a substrate with a high thermal resistance allows the graphene layer to be ablated without damage to the underlying substrate. This means that wiring traces or devices can be formed on the surface of the substrate. The substrate itself can then be cut through conventional means to form individual chips or devices.

The substrate of the present method may be any known MOCVD or VPE substrate so long as said substrate has a thermal resistance equal to or greater than that of sapphire. It is preferred that the substrate provides a crystalline surface upon which the graphene is produced as ordered crystal lattice sites provide a regular array of nucleation sites that promote the formation of good graphene crystal overgrowth. The most preferred substrates provide a high density of nucleation sites. The regular repeatable crystal lattice of substrates used for semiconductor deposition is ideal, the atomic stepped surface offering diffusion barriers. Preferably the substrate comprises sapphire or silicon carbide, preferably sapphire. Other suitable substrates may include silicon, diamond, nitride semiconductor materials (AlN, AlGaN, GaN, InGaN and complexes of), arsenide/phosphide semiconductors (GaAs, InP, AlInP and complexes of), provided that the substrate has a thermal resistance equal to or greater than that of sapphire.

MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials. Instead, the use of this term indicates to the person skilled in the art a general set of process and apparatus features. MOCVD is further distinct from CVD techniques by virtue of the system complexity and accuracy. While CVD techniques allow reactions to be performed with straight-forward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. CVD techniques cannot be used to achieve high quality graphene layer structures.

MOCVD can also be readily distinguished from atomic layer deposition (ALD) techniques. ALD relies on step-wise reactions of reagents with intervening flushing steps used to remove undesirable byproducts and/or excess reagents. It does not rely on decomposition or dissociation of the reagent in the gaseous phase. It is particularly unsuitable for the use of reagents with low vapour pressures such as silanes, which would take undue time to remove from the reaction chamber.

The measurement of thermal resistance is well known in the art and techniques include ASTM E1225, as well as transient plane source method, transient line source method, laser flash method, 3ω-method, and time-domain thermoreflectance method. The measurement of the thermal resistance to compare to sapphire is based on a substrate having the same size and is conducted under the conditions at which the laser ablation step is performed, i.e. preferably standard temperature and pressure.

The 3ω-method is most preferred. In this method an electrical current of frequency ω and alternating current Iω driven through a graphene heater line, causes heating at a frequency 2ω. The periodic heating creates a thermal wave; the amplitude of the temperature oscillation at the source depends on the thermal properties of the surrounding environment. The periodic temperature oscillation follows the periodic heating and occurs at a frequency 2ω but delayed in phase φ. This temperature oscillation then causes the resistance of the graphene heater to oscillate at 2ω. Due to the fact that the current is driven at a frequency ω and the resistance changes at a frequency 2ω, a voltage at 3ω results. The 3ω voltage is directly measurable and provides information on the thermal environment of the graphene heater line.

Generally it is preferred to have a substrate that is as thin as possible to ensure thermal uniformity across the substrate during graphene production. Preferred thicknesses are 50 to 300 microns, preferably 100 to 200 microns and more preferably about 150 microns. However, thicker substrates would also work and thick silicon wafers are up to 2 mm thick. The minimum thickness of the substrate is however determined in part by the substrate's mechanical properties and the maximum temperature at which the substrate is to be heated. The maximum area of the substrate is dictated by the size of the close coupled reaction chamber. Preferably the substrate has a diameter of at least 2 inches, preferably 2 to 24 inches and more preferably 6 to 12 inches. This substrate can be cut after growth to form individual devices using any known method. This substrate can be cut after growth to form individual devices using any known method.

The substrate is provided on a heated susceptor in a reaction chamber as described herein. Reactors suitable for use in the present method are well known and include heated susceptor capable of heating the substrate to the necessary temperatures. The susceptor may comprise a resistive heating element or other means for heating the substrate.

The chamber has a plurality of cooled inlets arranged so that, in use, the inlets are distributed across the substrate and have a constant separation from the substrate. The flow comprising a precursor compound may be provided as a horizontal laminar flow or may be provided substantially vertically. Inlets suitable for such reactors are well known and include Planetary and Showerhead reactors available from Aixtron.

The spacing between the substrate surface upon which the graphene is formed and the wall of the reactor directly above the substrate surface has a significant effect on the reactor thermal gradient. It is preferred that the thermal gradient is as steep as possible which correlates to a preferred spacing that is as small as possible. A smaller spacing changes the boundary layer conditions at the substrate surface that in turn promotes uniformity of graphene layer formation. A smaller spacing is also highly preferred as it allows refined levels of control of the process variables, for example reduced precursor consumption through lower input flux, lower reactor and hence substrate temperature which decreases stresses and non-uniformities in the substrate leading to more uniform graphene production on the substrate surface and hence, in most cases, significantly reduced process time.

Experimentation suggests a maximum spacing of about 100 mm is suitable. However, ore reliable and better quality two-dimensional crystalline material is produced using a much smaller spacing equal to or less than about 20 mm, such as 1 to 5 mm; a spacing equal or less than about 10 mm promotes the formation of stronger thermal currents proximate the substrate surface that increase production efficiency.

Where a precursor is used that has a relative low decomposition temperature such that there is likely to be a more than negligible degree of decomposition of the precursor at the temperature of the precursor inlet, a spacing below 10 mm is strongly preferred to minimise the time taken for the precursor to reach the substrate.

During the production method, a flow is supplied comprising a precursor compound through the inlets and into the reaction chamber to thereby decompose the precursor compound and form graphene on the substrate. The flow comprising a precursor compound may further comprise a dilution gas. Suitable dilution gases are discussed in more detail below.

Preferably the precursor compound is a hydrocarbon. Preferably a hydrocarbon which is a liquid at room temperature and most preferably a $C_5$ to $C_{10}$ alkane. The use of simple hydrocarbons is preferred since this gives a pure source of carbon with gaseous hydrogen as a by-product. In addition, since the hydrocarbons are liquid at room temperature, they can be obtained in a highly pure liquid form at low cost. Preferably the precursor compound is hexane.

The precursor is preferably in the gas phase when passed over the heated substrate. There are two variables to be considered: pressure within the close coupled reaction chamber and the gas flow rate into the chamber.

The preferred pressure selected depends upon the precursor chosen. In general terms, where precursors of greater molecular complexity are used, improved two-dimensional crystalline material quality and rate of production is observed using lower pressures, e.g. less than 500 mbar. Theoretically, the lower the pressure the better, but the benefit provided by very low pressures (e.g. less than 200 mbar) will be offset by very slow graphene formation rates.

Conversely for less complex molecular precursors, higher pressures are preferred. For example where methane is used as a precursor for graphene production, a pressure of 600 mbar or greater may be suitable. Typically, it is not expected to use pressures greater than atmospheric because of its detrimental impact on substrate surface kinetics and the mechanical stresses placed on the system. A suitable pressure can be selected for any precursor through simple empirical experimentation, which may involve for example, five test runs using respective pressures of 50 mbar, 950 mbar and three others of equidistance intervals between the first two. Further runs to narrow the most suitable range can then be conducted at pressures within the interval identified in the first runs as being most suitable. The preferred pressure for hexane is from 50 to 800 mbar.

The precursor flow rate can be used to control the graphene deposition rate. The flow rate chosen will depend upon the amount of the species within the precursor and the area of the layer to be produced. Precursor gas flow rate needs to be high enough to allow coherent graphene layer formation on the substrate surface. If the flow is above an upper threshold rate, bulk material formation, e.g. graphite, will generally result or increased gas phase reactions will occur resulting in solid particulates suspended in the gas phase that are detrimental to graphene formation and/or may contaminate the graphene layer. The minimum threshold flow rate can be theoretically calculated using techniques known to the person skilled in the art, by assessing the amount of the species required to be supplied to the substrate to ensure sufficient atomic concentrations are available at the substrate surface for a layer to form. Between the minimum and upper threshold rates, for a given pressure and temperature, flow rate and graphene layer growth rate are linearly related.

Preferably a mixture of the precursor with a dilution gas is passed over the heated substrate within a close coupled reaction chamber. The use of a dilution gas allows further refinement of the control of the carbon supply rate.

It is preferred that the dilution gas includes one or more of hydrogen, nitrogen, argon and helium. These gases are selected because they will not readily react with a large number of available precursors under typical reactor conditions, nor be included in the graphene layer. Notwithstanding, hydrogen may react with certain precursors. Additionally, nitrogen can be incorporated into the graphene layer under certain conditions. In such instances one of the other dilution gases can be used.

In spite of these potential problems, hydrogen and nitrogen are particularly preferred because they are standard gases used in MOCVD and VPE systems.

The susceptor is heated to a temperature of at least 50° C. in excess of a decomposition temperature of the precursor, more preferably from 100 to 200° C. in excess. The preferred temperature to which the substrate is heated is dependent upon the precursor selected. The temperature selected needs to be high enough to allow at least partial decomposition of the precursor in order to release the species, but preferably not so high as to promote increased recombination rates in the gas phase away from the substrate surface and hence production of unwanted by-products. The selected temperature is higher than the complete decomposition temperature to promote improved substrate surface kinetics and so encourage formation of graphene with good crystal quality. For hexane, the most preferred temperature is about 1200° C., such as from 1150 to 1250° C.

In order for there to be a thermal gradient between the substrate surface and the introduction point for precursor, the inlet will need to be of a lower temperature than the substrate. For a fixed separation a greater temperature difference will provide a steeper temperature gradient. As such it is preferred that at least the wall of the chamber through which the precursor is introduced, and more preferably the walls of the chamber are cooled. Cooling may be achieved using a cooling system, for example, using fluid, preferably liquid, most preferably water, cooling. The reactor's walls may be maintained at constant temperature by water cooling. The cooling fluid may flow around the inlet(s) to ensure that the temperature of the inner surface of the reactor wall through which the inlets extend, and thus of the precursor itself as it passes through the inlet and into the reaction chamber, is substantially lower than the substrate temperature. The inlets are cooled to less than 100° C., preferably 50 to 60° C.

The method further comprises a step of using a laser to selectively ablate graphene from the substrate. Suitable lasers are those having wavelength in excess of 600 nm and a power of less than 50 Watts. Preferably the laser has a wavelength of from 700 to 1500 nm. Preferably the laser has a power of from 1 to 20 Watts. This allows the graphene to be readily removed without damaging the neighbouring graphene or the substrate.

The inventors have surprisingly found that $CO_2$ lasers and other lasers working at similar wavelengths are particularly suitable for selectively ablating the graphene from the substrate. Suitable lasers are those having wavelength in excess of 8 µm, preferably from 9 to 15 µm and most preferably from 9.4 to 10.6 µm and a power of from 5 to less than 50 Watts, preferably from 10 to 45 Watts, most preferably from 12 to 20 Watts. The inventors have surprisingly found that the graphene does not readily absorb the energy at this frequency and therefore less damage to the graphene occurs, even at higher power. The thermal resistance of the substrate ensures that it does not allow the energy of the laser to damage the adjoining graphene layer structure. This means that the ablation can be performed more quickly and can even be used to etch away at least a portion of the substrate, preferably to a depth of 1 to 300 nm.

The ability to etch the substrate facilitates removal of the graphene layer structure from the substrate. Without wishing to be bound by theory, it is believed that this exposes edges of the graphene sheet which can then be more readily removed. Techniques for separating the graphene from the substrate are known in the art and include cavitation techniques (such as ultrasound) and solution etching (such as with semiconductor cleaning solutions including RCA1).

Preferably the laser spot size is kept as small as possible (i.e. have a better resolution). For example, the present inventors have worked at a spot size of 25 microns. Focus should be as precise as possible. It has also been found that it is better to pulse the laser as opposed to continuous lasing, in order to prevent substrate damage.

For some embodiments it may be desirable to dope the graphene. This may be achieved by introducing a doping element into the close coupled reaction chamber and selecting a temperature of the substrate, a pressure of the reaction chamber and a gas flow rate to produce a doped graphene. Straightforward empirical experimentation can be used to determine these variables using the guidance described above. This process can be used with or without a dilution gas.

There is no perceived restriction as to doping element that may be introduced. Commonly used dopant elements for the production of graphene include silicon, magnesium, zinc, arsenic, oxygen, boron, bromine and nitrogen.

Preferably the method disclosed herein is for the production of a Hall sensor, the method comprising:
using the laser to selectively ablate graphene to thereby define a hall-sensor portion of the graphene on the substrate.

A Hall effect sensor is a well-known component in the art. it is a transducer that varies its output voltage in response to a magnetic field. Hall effect sensors are used for proximity switching, positioning, speed detection, and current sensing applications. In a Hall effect sensor a thin strip of a conductor has a current applied along it, in the presence of a magnetic field the electrons are deflected towards one edge of the conductor strip, producing a voltage gradient across the short-side of the strip (perpendicular to the feed current). In contrast to inductive sensors, Hall effect sensors have the advantage that they can detect static (non-changing) magnetic fields.

More preferably the method is for use in the provision of a plurality of Hall sensor portions on the substrate. This would allow multiple detectors on the same substrate, or for the substrate to then be divided by conventional means into a plurality of sensors.

According to another embodiment, the method is for the production of a Hall sensor device precursor, the method comprising:
using the laser to selectively ablate graphene to thereby define a hall-sensor portion of the graphene on the substrate, and an associated graphene wire circuit for connection to electronic components to complete a hall sensor device.

Preferably the method further comprises applying contacts to a surface of the graphene layer structure. This allows for the formation of an electrical circuit.

According to another aspect, the present method is for the production of a graphene layer structure for the production of a filter, the method comprising:
using the laser to selectively ablate a plurality of pores distributed across a surface of the graphene; and
separating the graphene from the substrate.

Preferably the graphene is separated from the substrate after the step of using the laser to selectively ablate a plurality of pores distributed across a surface of the graphene.

A filter made in this way can have a predefined pattern of very fine pores across the surface. This makes it especially suitable for a number of filtration purposes on a very fine scale. It has been found that pores can be formed having a diameter of less than 50 μm, preferably less than 25 μm. The size of the pores which can be achieved will depend on the spot size of the laser used and may become smaller as laser focusing improves. It is considered that at present it would be possible to achieve a pore size down to 1 μm.

Elements of the above-described method will now be discussed in more detail.

A close coupled reaction chamber provides a separation between the substrate surface upon which the graphene is formed and the entry point at which the precursor enters the close coupled reaction chamber that is sufficiently small that the fraction of precursor that reacts in the gas phase within the close coupled reaction chamber is low enough to allow the formation of graphene. The upper limit of the separation may vary depending upon the precursor chosen, substrate temperate and pressure within the close coupled reaction chamber.

Compared with the chamber of a standard CVD system, the use of a close coupled reaction chamber, which provides the aforementioned separation distance, allows a high degree of control over the supply of the precursor to the substrate; the small distance provided between the substrate surface on which the graphene is formed and the inlet through which the precursor enters the close coupled reaction chamber, allows for a steep thermal gradient thereby providing a high degree of control over the decomposition of the precursor.

The relatively small separation between the substrate surface and the chamber wall provided by a close coupled reaction chamber, compared with the relatively large separation provided by a standard CVD system allows:
1) a steep thermal gradient between the precursor's entry point and the substrate surface;
2) a short flow path between the precursor entry point and the substrate surface; and
3) a close proximity of the precursor entry point and the point of graphene formation.

These benefits enhance the effects that deposition parameters including substrate surface temperature, chamber pressure and precursor flux have on the degree of control over the delivery rate of the precursor to the substrate surface and the flow dynamics across the substrate surface.

These benefits and the greater control provided by these benefits enable minimisation of gas phase reactions within the chamber, which are detrimental graphene deposition; allow a high degree of flexibility in the precursor decomposition rate, enabling efficient delivery of the species to the substrate surface; and gives control over the atomic configuration at the substrate surface which is impossible with standard CVD techniques Through both simultaneously heating the substrate and providing cooling to the wall of the reactor directly opposite the substrate surface at the inlet, a steep thermal gradient can be formed whereby the temperature is a maximum at the substrate surface and drops rapidly towards the inlet. This ensures the reactor volume above the substrate surface has a significantly lower temperature than the substrate surface itself, largely reducing the probability of precursor reaction, in the gas phase, until the precursor is proximate the substrate surface.

An alternative design of MOCVD reactor is also contemplated which has been demonstrated to be efficient for graphene growth as described herein. This alternative design is a so-called High Rotation Rate (HRR) or "Vortex" flow system. Whereas the close-coupled reactor described above focussed on creating graphene using a very high thermal gradient, the new reactor has a significantly wider spacing between the injection point and growth surface or substrate. Close coupling allowed extremely rapid dissociation of precursors delivering elemental carbon, and potentially other doping elements, to the substrate surface allowing the formation of graphene layers. In contrast, the new design relies on a vortex of the precursors.

In the new reactor design, in order to promote laminar flow over the surface this system utilizes a higher rotation rate to impinge a high level of centrifugal acceleration on the injected gas stream. This results in a vortex type fluid flow within the chamber. The effect of this flow pattern is a significantly higher residency time of the precursor molecules proximate to the growth/substrate surface compared to other reactor types. For the deposition of graphene this increased time is what promotes the formation of elemental layers.

However, this type of reactor does have a couple of parasitic issues, firstly the amount of precursor required to achieve the same amount of growth as other reactors increases due to the reduced mean free path that this flow regime causes, resulting in more collisions of precursor molecules delivering non-graphene growth atomic recombination. However, the use of reagents such as hexane which are relatively cheap means that this problem can be readily overcome. Additionally, the centrifugal motion has varying impacts on atoms and molecules of different sizes resulting in the ejection of different elements at different velocities. While this probably assists graphene growth due to the uniform rate of carbon supply with ejection of unwanted precursor by-products it can be detrimental to desired effects such as elemental doping. It is therefore preferred to use this design of reactor for undoped graphene, such as is desirably used for hall sensors or filters as described herein.

An example of such a reaction system is the Veeco Instruments Inc. Turbodisc technology, K455i or Propel tools.

Preferably the reactor used herein in a high rotation rate reactor. This alternative design of reactor may be characterised by its increased spacing and high rotation rate. Preferred spacings are from 50 to 120 mm, more preferably 70 to 100 mm. The rotation rate is preferably from 100 rpm to 3000 rpm, preferably 1000 rpm to 1500 rpm.

The reactor of FIG. 1 is constructed for the deposition of a graphene layer on a substrate through the method of Vapour Phase Epitaxy (VPE), in which a precursor is introduced to thermally, chemically and physically interact in the vicinity of and on the substrate to form a graphene layer structure having from 1 to 40, preferably 1 to 10 graphene layers.

The apparatus comprises a close coupled reactor 1 having a chamber 2 having inlets 3 provided through a wall 1A and at least one exhaust 4. A susceptor 5 is arranged to reside within the chamber 2. The susceptor 5 comprises one or more recesses 5A for retaining one or more substrates 6. The apparatus further comprises means to rotate the susceptor 5 within the chamber 2; and a heater 7, e.g. comprising a resistive heating element, or RF induction coil, coupled to the susceptor 5 to heat the substrate 6. The heater 7 may comprise a single or multiple elements as required to achieve good thermal uniformity of the substrate 6. One or more sensors (not shown) within the chamber 2 are used, in conjunction with a controller (not shown) to control the temperature of the substrate 6.

The temperature of the walls of the reactor 1 are maintained at substantially constant temperature by water cooling.

The reactor walls define one or more internal channels and/or a plenum 8 that extend substantially adjacent (typically a couple of millimetres away) the inner surface of reactor walls including inner surface 1B of wall 1A. During operation, water is pumped by a pump 9 through the channels/plenum 8 to maintain the inside surface 1B of wall 1A at or below 200° C. In part because of the relatively narrow diameter of the inlets 3, the temperature of the precursor (which is typically stored at a temperature much below the temperature of inside surface 1B), as it passes through inlets 3 through wall 1A into the chamber 1 will be substantially the same or lower than the temperature of the inside surface 1B of wall 1A.

The inlets 3 are arranged in an array over an area that is substantially equal or greater than the area of the one or more substrates 6 to provide substantially uniform volumetric flow over substantially the entirety of surfaces 6A of the one or more substrates 6 that face the inlets 3.

The pressure within the chamber 2 is controlled through control of precursor gas flows through inlet(s) 3 and exhaust gas through exhaust 4. Via this methodology, the velocity of the gas in the chamber 2 and across the substrate surface 6A and further the mean free path of molecules from the inlet 3 to substrate surface 6A are controlled. Where a dilution gas is used, control of this may also be used to control pressure through inlet(s) 3. The precursor gas is preferably hexane.

The susceptor 5 is comprised from a material resistant to the temperatures required for deposition, the precursors and dilution gases. The susceptor 5 is usually constructed of uniformly thermally conducting materials ensuring substrates 6 are heated uniformly. Examples of suitable susceptor material include graphite, silicon carbide or a combination of the two.

The substrate(s) 6 are supported by the susceptor 5 within the chamber 2 such that they face wall 1A with a separation, denoted in FIG. 1 by X, of between 1 mm-100 mm, though, as discussed above, generally the smaller the better. Where the inlets 3 protrude into or otherwise sit within the chamber 2, the relevant separation is measured between the substrate(s) 6 and exit of the inlets 3.

The spacing between the substrate 6 and the inlets 3 may be varied by moving the susceptor 5, substrate 6 & heater 7.

An example of a suitable close coupled reactor is the AIXTRON® CRIUS MOCVD reactor, or AIXTRON® R&D CCS system.

Precursors in gaseous form or in molecular form suspended in a gas stream are introduced (represented by arrows Y) into the chamber 2 through inlets 3 such that they will impinge on or flow over the substrate surface 6A. Precursors that may react with one another are kept separated until entering the chamber 2 by introduction through different inlets 3. The precursor or gas flux/flow rate is controlled externally to the chamber 2 via a flow controller (not shown), such as a gas mass flow controller.

A dilution gas may be introduced through an inlet or inlets 3 to modify gas dynamics, molecular concentration and flow velocity in the chamber 2. The dilution gas is usually selected with respect to the process or substrate 6 material such that it will not have an impact on the growth process of the graphene layer structure. Common dilution gases include Nitrogen, Hydrogen, Argon and to a lesser extent Helium.

After the graphene layer structure having from 1 to 40, preferably 1 to 10 graphene layers has been formed, the reactor is then allowed to cool and the substrate 6 is retrieved having the graphene layer structure thereon. The substrate 6 is then registered within a laser ablation rig comprising, for example, a HeNe laser having a wavelength of 1152 nm and a strength of 10 W or a $CO_2$ laser having a wavelength of 10.6 μm and a strength of 45 Watts. The laser rig was then used to define a circuit having graphene contacts on the substrate.

EXAMPLES

The present invention will now be described further with reference to the following non-limiting examples.

The following describes example processes using the aforementioned apparatus that successfully produced graphene layer structure having from 1 to 40, preferably 1 to 10 graphene layers. In all examples a close coupled vertical reactor of diameter 250 mm with six 2"(50 mm) target substrates were used. For reactors of alternate dimensions and/or different target substrate areas, the precursor and gas flow rates can be scaled through theoretical calculation and/or empirical experimentation to achieve the same results.

Using the method of the invention it has been possible to produce patterned graphene with substantially improved properties over known methods, for example with a grain size greater than 20 μm, covering a substrate of 6 inch diameter with 98% coverage, a layer uniformity of >95% of the substrate, sheet resistivity less than 450 Ω/sq and electron mobility greater than 2435 $cm^2$/Vs. The most recent tests on a graphene layer produced using the method of the invention have demonstrated electron mobility >8000 $cm^2$/V s across the full layer tested at standard conditions for temperature and pressure. The method has been able to produce graphene layers across a substrate of 6 inches (15 cm) having undetectable discontinuity, measured by standard Raman and AFM mapping techniques to micron scale. The method has also shown to be able to produce a uniform graphene monolayer and stacked uniform graphene layers across the substrate without formation of additional layer fragments, individual carbon atoms or groups of carbon atoms on top of the or uppermost uniform monolayer.

The following description details how to create one monolayer of graphene on a sapphire substrate, using the process of Metal Organic Chemical Vapour Deposition (MOCVD), delivering high quality, high mobility material suitable for electronics.

I. Wafer(s) of sapphire are loaded into the MOCVD reactor chamber.
II. The reactor is closed which results in the gas injectors being located 10-11 mm above the substrate surface.
III. The reactor chamber pump-purge cycled to remove any presence of the ambient environment.
IV. A gas flow of 10 slm of hydrogen is introduced to the reactor and remains on constantly.
V. The reactor pressure is reduced to 50 mbar.
VI. The reactor temperature (i.e. the susceptor) and by association the wafer(s) are heated up to 1050° C.
VII. The temperature is allowed to stabilise for 3 minutes after reaching the set-point.
VIII. Hexane is introduced to the reactor chamber via gas stream pick up from a liquid source at a flow of 0.1 slm for a period of 2 minutes. This allows a graphene 'nucleation' structure to be formed on the substrate surface.
IX. The hexane flow is turned off.
X. The wafer temperature is increased to 1350° C.
XI. The temperature is allowed to stabilise for 3 minutes after reaching the set-point.
XII. Hexane is reintroduced to the reactor chamber, again via gas stream pick up from a liquid source, this time at a flow of 0.2 slm for 8 minutes.
XIII. The hexane flow is turned off to the reactor chamber
XIV. The reactor is cooled to room temperature in 15 minutes, with hydrogen still flowing
XV. The reactor chamber is increased back to atmospheric pressure using nitrogen gas
XVI. The wafers are now ready to be unloaded.

The above process can be varied to produce graphene with slightly varying properties, such as carrier concentration and electron mobility, by modifying some of the above variables, such as gas flow rate, Hexane flow rate, substrate temperature.

The sapphire wafers have a thermal conductivity coefficient (the reciprocal of thermal resistance) at 298 K orthogonal to the C-axis of 30.3 W/m K, parallel to the C-axis is 32.5 W/mK and at 60° C. of 27.2 W/m K. An alternative substrate could be used at 298K provided it has a lower or equal thermal conductivity coefficient (i.e. higher thermal resistance).

The following is a description of how to create Hall effect sensors using the above wafer-scale graphene material. The following fabrication process uses graphene on sapphire substrates, produced using the process detailed above.

I. A custom-designed mask is placed over the graphene wafer leaving only the areas where electrical contacts are required exposed
II. Electrical contacts comprising of 5 nm of chromium and 70 nm of gold are deposited onto the graphene surface, through the mask using a standard metal depositing technique, such as electron-beam deposition.
III. The wafer is removed from the metal deposition system and the mask is removed from the wafer.
IV. The wafer is placed into a laser etching system. The power was about 8 W, but in there is a fairly wide window here, depending on the thermal insulative properties of the substrate.
V. The laser is directed towards the graphene wafer and set at a power and wavelength suitable for ablating graphene from the wafer surface.
VI. The laser is controlled such that patterns are ablated into the graphene material. These patterns form the shapes of the desired devices. The vapourisation of the graphene is controlled such that the pattern is formed around the deposited electrical contacts, without overlap. With good control this allows the formation of multiple graphene Hall effect sensors on a single wafer
VII. The wafer is removed from the laser patterning system delivering a number of graphene based sensors on the sapphire substrate.

All percentages herein are by weight unless otherwise stated.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The invention claimed is:

1. A method for the production of a graphene layer structure having from 1 to 100 graphene layers, the method comprising:
   providing a substrate having a thermal resistance equal to or greater than that of sapphire, on a heated susceptor in a reaction chamber, the chamber having a plurality of cooled inlets arranged so that, in use, the inlets are distributed across the substrate and have a constant separation from the substrate,
   supplying a flow comprising a precursor compound through the inlets and into the reaction chamber to thereby decompose the precursor compound and form graphene on the substrate,
   wherein the inlets are cooled to less than 100° C., and the susceptor is heated to a temperature of at least 50° C. in excess of a decomposition temperature of the precursor,
   using a laser to selectively ablate graphene from the substrate,
   wherein the laser has a wavelength in excess of 600 nm and a power of less than 50 Watts.

2. The method according to claim 1, wherein the substrate comprises sapphire or silicon carbide.

3. The method according to claim 1, wherein the laser:
   (a) has a wavelength of from 700 to 1500 nm; and/or
   (b) has a power of from 1 to 20 Watts.

4. The method according to claim 1, wherein the laser:
   (a) has a wavelength of at least 8 µm; and/or
   (b) has a power of from 5 to less than 50 Watts.

5. The method according to claim 1, wherein the precursor compound is a hydrocarbon which is a liquid at room temperature.

6. The method according to claim 5, wherein the precursor compound is hexane.

7. The method according to claim 1, wherein the substrate has a diameter of at least 6 inches.

8. The method according to claim 1, wherein the step of using a laser to selectively ablate graphene from the substrate further comprises etching away at least a portion of the substrate to a depth of 1 to 300 nm.

9. The method according to claim 1, the method further comprising removing the graphene layer structure from the substrate.

10. The method according to claim 1, wherein the graphene layer structure is a component of a Hall sensor, the method comprising:
    using the laser to selectively ablate graphene to thereby define a hall-sensor portion of the graphene on the substrate.

11. The method according to claim 10, for use in the provision of a plurality of Hall sensor portions on the substrate.

12. The method according to claim 10, the method comprising:
    using the laser to selectively ablate graphene to thereby define a hall-sensor portion of the graphene on the substrate, and an associated graphene wire circuit for connection to electronic components to complete a hall sensor device.

13. The method according to claim 1, the method further comprising applying contacts to a surface of the graphene layer structure.

14. The method according to claim 1 wherein the graphene layer structure is a component of a filter, the method comprising:
    using the laser to selectively ablate a plurality of pores distributed across a surface of the graphene; and
    separating the graphene from the substrate.

15. The method according to claim 14, wherein the graphene is separated from the substrate after the step of using the laser to selectively ablate a plurality of pores distributed across a surface of the graphene.

* * * * *